United States Patent [19]

Moustakas

[11] Patent Number: 4,533,450

[45] Date of Patent: Aug. 6, 1985

[54] CONTROL OF THE HYDROGEN BONDING IN REACTIVELY SPUTTERED AMORPHOUS SILICON

[75] Inventor: Theodore D. Moustakas, Berkeley Heights, N.J.

[73] Assignee: Exxon Research and Engineering Co., Florham Park, N.J.

[21] Appl. No.: 648,012

[22] Filed: Sep. 6, 1984

Related U.S. Application Data

[63] Continuation of Ser. No. 514,195, Jul. 15, 1983, abandoned, which is a continuation of Ser. No. 213,034, Dec. 4, 1980, abandoned, which is a continuation-in-part of Ser. No. 108,469, Dec. 31, 1979, abandoned.

[51] Int. Cl.$^3$ .............................................. C23C 15/00
[52] U.S. Cl. ................................ 204/192 S; 136/258; 204/192 R; 204/192 P; 204/298
[58] Field of Search ............ 204/192 S, 192 P, 192 R, 204/298; 136/258 AM

[56] References Cited

U.S. PATENT DOCUMENTS 4,251,289 2/1981 Moustakas et al. ............. 204/192 S
4,353,788 10/1982 Jeffrey et al. ..................... 204/192 S
4,417,092 11/1983 Moustakas ........................ 204/192 P

OTHER PUBLICATIONS

Thompson et al., Proceedings Int'l Photovol. Sol. En. Conf.; Luxembourg, pp. 231–240, Sep. 1977.
Ho et al., IBM Tech. Disc. Bull., 18, (1976), pp. 3093–3094.
Brodsky et al., IBM Tech. Disc. Bull., 19, (1977), pp. 4802–4803.
Allison et al., Proc. 3rd Europ. Comm. Photovol. Sol. Conf., Oct. 27–30, 1980, pp. 820–824.
Suzuki et al., Jap. Journ. Appl. Phys., 20, (1981), pp. L485–L487.
Martin, Solar Energy Mat., 2, (1979), pp. 143–147.

*Primary Examiner*—Arthur P. Demers
*Attorney, Agent, or Firm*—Ronald D. Hantman

[57] ABSTRACT

A reactively sputtered photoconductive amorphous silicon film having a controlled monohydride and polyhydride bond density is produced by applying a DC voltage bias to the film's substrate during deposition.

9 Claims, 3 Drawing Figures

CONTROL OF THE HYDROGEN BONDING IN REACTIVELY SPUTTERED AMORPHOUS SILICON

CROSS-REFERENCE TO RELATED APPLICATIONS

This is a continuation of Ser. No. 514,195, filed July 15, 1983, now abandoned, which is a continuation of Ser. No. 213,034, filed on Dec. 4, 1980, now abandoned, which is a continuation-in-part of Ser. No. 108,469, filed Dec. 31, 1979, now abandoned.

FIELD OF THE INVENTION

The present invention relates to amorphous silicon and more particularly to reactively sputtered hydrogenated amorphous silicon in which the hydrogen is bonded selectively in monohydride or polyhydride configurations.

BACKGROUND OF THE INVENTION

The two principal methods of producing hydrogenated amorphous silicon are the glow discharge decomposition of silane and reactive sputtering in a mixture of argon and hydrogen. Hydrogenated amorphous silicon films produced by these techniques are known to have differences in optical and electronic properties. Those of the art attribute some these distinctions to the differences in the bonding configuration of hydrogen into the amorphous silicon network. For example, when hydrogen bonds in polyhydride configurations, it introduces electronic defects in the gap of the semiconductor and also influences the optical gap of the material by modifying the valence and possibly the conduction bands. In view of these observations, previous efforts have attempted to identify the deposition parameters which controls the bonding of hydrogen into the amorphous network.

The silicon-hydrogen bonding characteristics in photoconductive amorphous silicon is conventionally explained in relation to the local environments of the incorporated hydrogen. Those of the art believe that the hydrogen can be present either in the monohydride SiH form, isolated dihydride $SiH_2$ units, coupled dihydride $SiH_2$ units, higher order polyhydrides such as $SiH_3$, or combinations thereof. For purposes of the present application, the term polyhydride will be used to collectively define all silicon-hydrogen bonding forms other than the monohydride, SiH. Typically, infrared absorbtion or vibration spectra data is used to analyze the bonding characteristics of the silicon film. An analysis of the silicon-hydrogen vibrational spectra indicates the density of silicon to hydrogen bonding of the monohydride and polyhydride forms.

Referring momentarily to the drawings, an illustration of an infrared absorption spectra is shown in FIG. 2. The three absorption bands are identified as the stretching ($\sim 2000 cm^{-1}$), bending ($\sim 900 cm^{-1}$) and wagging ($\sim 600 cm^{-1}$) modes of SiH and $SiH_x$ groupings. The presence of polyhydrides in the film is evidenced by the bending modes, whose origin are forces opposing changes in the angles between Si—H bonds within $SiH_2$ and $SiH_3$ groups. Contrary to the stretching and wagging vibrations, the bending modes are absent when the hydrogen is bonded only in monohydride configurations. For purposes of the present invention, the bonding mode evidenced at 2000 $cm^{-1}$ is the stretching vibration of monohydride groups and the bonding mode evidenced at 2100 $cm^{-1}$ is the stretching vibration of the polyhydride groups. The integrated absorption under these two modes provides a measure of the density of monohydride and polyhydride bonds respectively. The present invention teaches deposition techniques for producing reactively sputtered photoconductive amorphous silicon films having controlled monohydride and polyhydride bond densities. A positive or negative DC voltage bias applied to the substrates during the sputter deposition increases or decreases the relative density of monohydride to polyhydride bonds in the resultant film.

The ability to control the relative density of the monohydride and polyhydride bonds afforded by the present invention, further provides the ability to control the optical properties of the resultant film and more particularly the optical band gap. This ability is generally considered an important advantage in optimizing the photovoltaic characteristics of amorphous silicon hydride.

The art has demonstrated the ability to control the relative density of monohydride and polyhydride bonds in amorphous silicon produced by glow discharge decomposition of silane. For example, Brodsky et al in a technical—publication entitled "Infrared & Raman spectra of the silicon-hydrogen bonds in amorphous silicon prepared by glow discharge and sputtering" teach the basic glow discharge deposition parameters which control the bonding of hydrogen. Films produced at low silane pressure ($\sim 0.1$ monohydrides (The stretching vibration is centered around 2000 $cm^{-1}$). Films produced at low temperatures ($T_s \sim 25°$ C.) and higher silane pressure ($\sim 1$ Torr) contain primarily polyhydrides (The stretching vibration is centered around 2100 $cm^{-1}$).

Predetermined control of the bonding of hydrogen in sputtered hydrogenated amorphous silicon has not been previously achieved in the art. Indeed Brodsky et al, in *Physical Review*, B. 16, No. 8, 10/77 and Freeman et al, in *Physical Review* B. 18, No. 8, 10/15/78, teach that for sputter deposited amorphous silicon the stretching vibration is always a doublet, which together with the existence of the bending mode at 900 $cm^{-1}$ teach that the sputtered films always contain a mixture of monohydride and polyhydride bonding configurations. One technique for altering the densities of the monohydride and polyhydride bonds is set forth by F. R. Jeffrey et al in J. of Applied Physics, Vol. 50 p. 7034 (1979) wherein a change in the relative density of monohydride to dihydride bonding was noted for films sputtered at different power levels.

SUMMARY OF THE INVENTION

An amorphous silicon film is reactively sputtered onto a DC biased substrate to control the density of monohydride and polyhydride bonds formed in the resultant film. A positive bias applied to the substrate decreases the density of polyhydride bonds and increases the density of monohydride bonds.

DETAILED DESCRIPTION OF THE INVENTION

Figure 1:
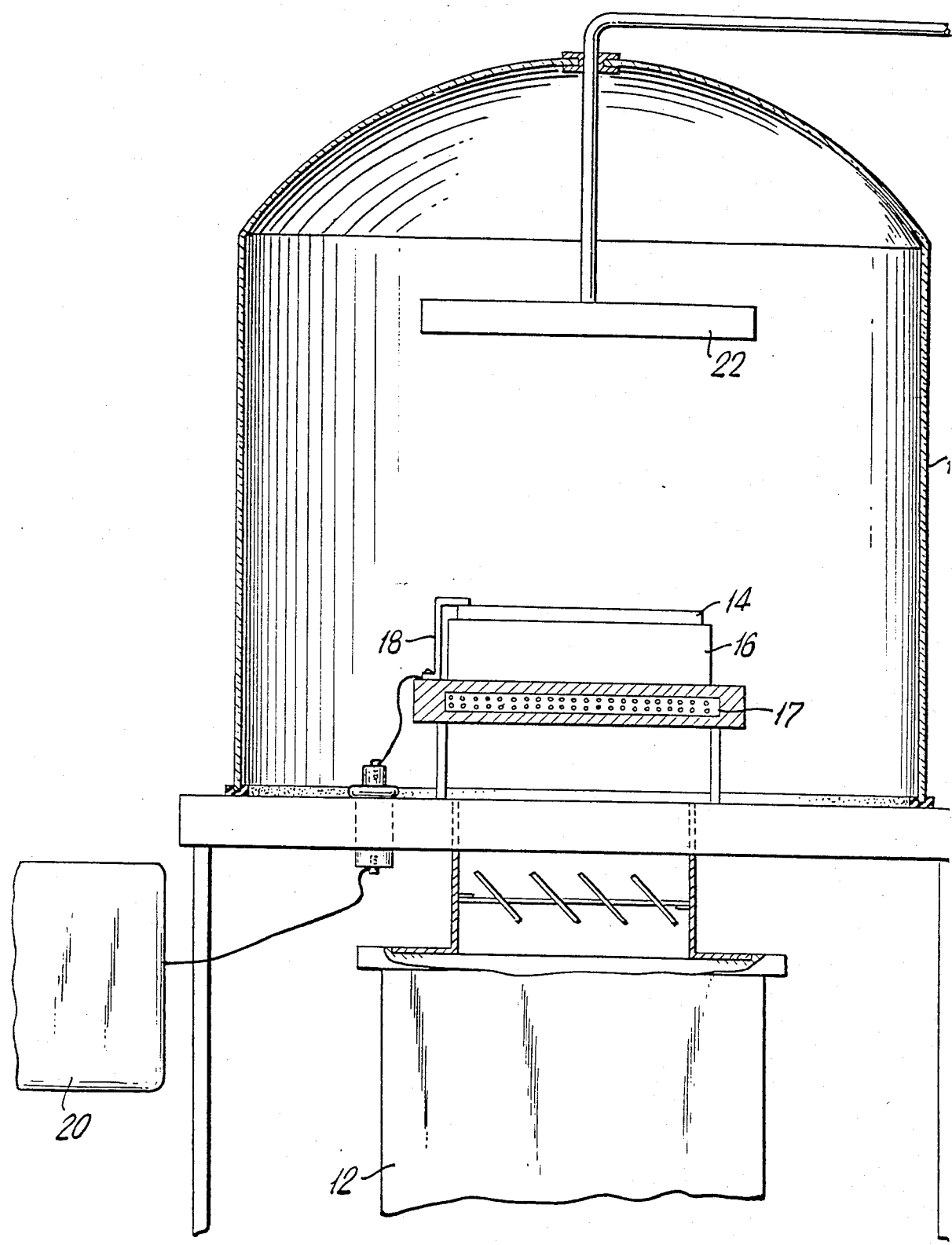
FIG. 1 is a diagrammatic illustration of a deposition system for producing the amorphous silicon films of the present invention.

The present invention teaches a method for reactively sputtering amorphous silicon films having a controlled monohydride and polyhydride bonding density. To illustrate this invention, FIG. 1 shows a sputtering apparatus adapted to provide voltage biasing on a substrate to be coated. Referring to the drawing, a vacuum chamber 10 is capable of being evacuated by pumping means 12, preferably to a pressure of about $10^{-7}$ torr. Substrate(s) 14 is secured to platform 16 which serves simultaneously as a substrate support and a anode electrode. In general, substrate 14 may comprise any material capable of withstanding temperatures of about 400° C. For electronic applications however, substrate 14 preferably comprises a material having a coating surface devoid of defects of the order of about a micron in size and free of materials which may migrate into the silicon to the detriment of its semiconductor properties. In many embodiments, substrate 14 may comprise a dielectric material such as glass which would electrically insulate the coating surface from the bias platform. For such embodiments, substrate 14 is typically coated with a conductive layer such as a metallic thin film, then secured to platform 16 by conductive securing means, here shown at 18,18. The substrates used for infrared optical measurements are single crystal Si wafers polished on both sides. Chamber 10 is then closed and evacuated to a pressure preferably about or below $10^{-7}$ torr.

A power supply 20, capable of supplying positive and negative DC voltage, is coupled to supply a DC bias voltage to platform 16 and substrate(s) 14. Platform 16 is electrically isolated from surrounding support structures which are typically held at ground potential. Power supply 20 is capable of supplying $\pm 100$ volts to the substrate, measured relative to ground potential. The evacuated chamber is backfilled with an inert gas such as argon to bring the steady state pressure of chamber 10 into a range suitable for sputtering, typically between about 5 m torr and about 50 m torr, preferably about 15 m torr. Alternatively, the argon backfilling may be interrupted and the chamber re-evacuated to high vacuum and subsequently backfilled to sputtering pressures. This process, repeatable to advantage, assures the removal of residuary atmosphere.

A partial pressure of hydrogen ranging from about $1\times10^{-4}$ torr to about $5\times10^{-3}$ torr with a preferable upper range of about $1\times10^{-3}$ torr is fed into the vacuum chamber. As known to those of the art, the hydrogen constitutes the reactive sputtering gas which will be decomposed to its atomic state and be incorporated into the resultant amorphous silicon film. In many device embodiments, it is desirable to provide an extrinsic doping material to alter the semiconductor characteristics of the silicon. Partial pressures of doping gases such as phosphine or diborane, ranging from about $5\times10^{-6}$ torr to about $5\times10^{-5}$ torr for example, may be added prior to or during the sputter deposition to provide a number of device configurations, each well known in the art.

Figure 2:
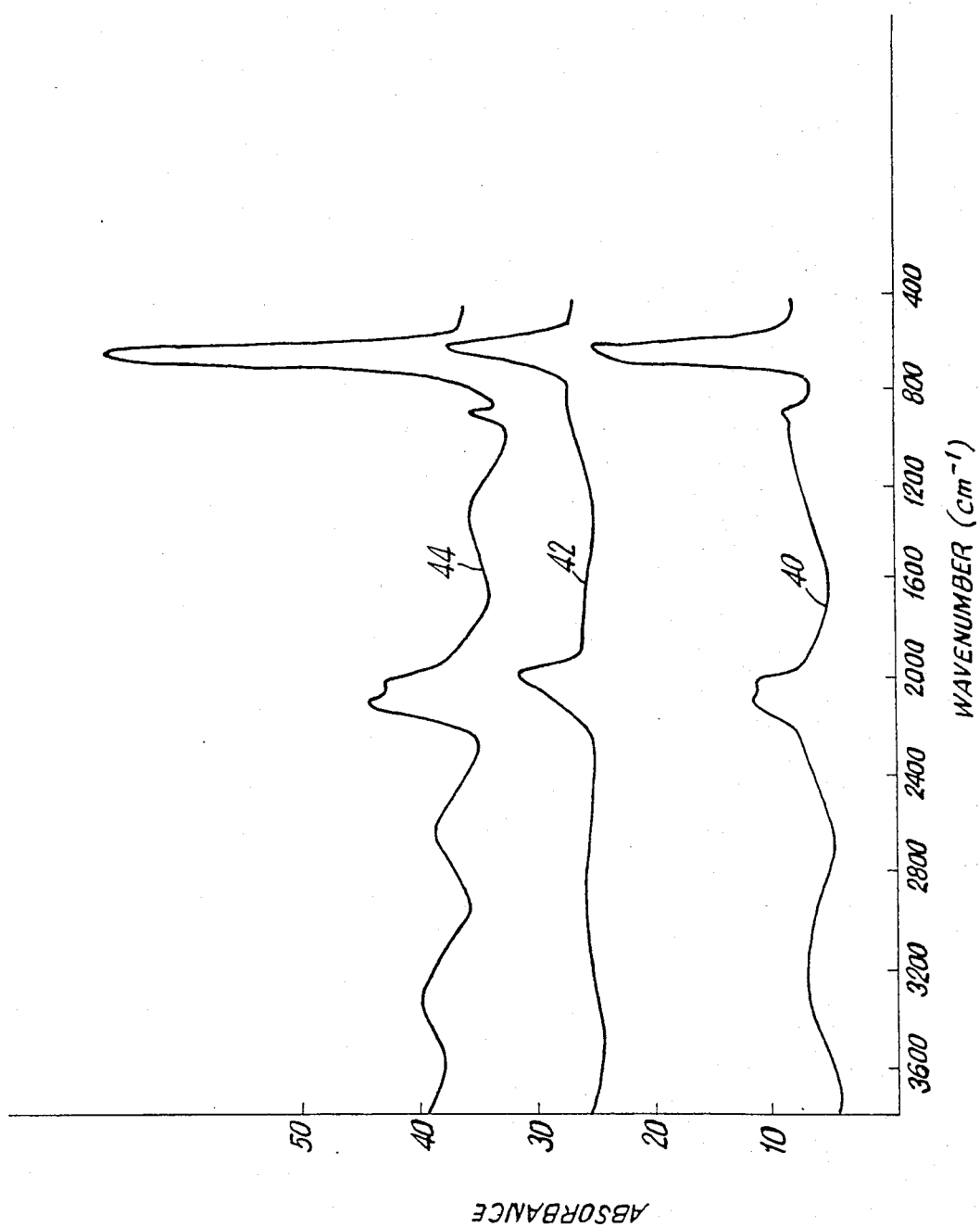
FIG. 2 is a graphic plot of absorbtion versus wavelength, commonly known as an Infrared Absorbtion spectra illustrating the bonding vibration spectra for several amorphous silicon films.

Throughout the deposition, the substrate(s) is maintained at a temperature ranging from 200° C. to about 400° C. Heater element 17, here shown as below and proximate to platform 16 and substrate(s) 14, may comprise any of a number of heating means capable of sustaining the aforedescribed requisite substrate temperature. Sputter deposition is then initiated by conventional capacitive coupling of radio frequency, hereinafter RF, power to the partial pressures of gases proximate to an anode and cathode electrode. The cathode comprises a polysilicon target, 5" in diameter, here shown at 22. The anode comprises the assembly of platform 16, substrate(s) 14 and securing means 18. As discussed earlier, the anode assembly is maintained at a predetermined potential relative to ground, typically ranging from about +100 volts to about −100 volts. The RF (voltage power) supplied to the cathode assembly typically ranges from 100 watts to about 500 watts for an anode to cathode spacing of 4.5 centimeters, resulting in a deposition rate of between 2 Å/second and 4 Å/ second. During the sputter deposition process, a partial pressure of hydrogen is dissociated within the sputtering plasma. Atomic hydrogen is incorporated into the silicon film in varying forms. Using conventional sputtering techniques, wherein the substrates are maintained at ground potential or allowed to self-bias from the charging effect of the plasma, the incorporated hydrogen is bonded to the silicon in both the monohydride and polyhydride form as taught by the prior art. Referring now to FIG. 2, trace 40, the conventional deposition techniques result in a film having vibrational spectra for silicon-hydrogen bonding which demonstrate both monohydride characteristic peaks at 2000 cm$^{-1}$ and polyhydride characteristic peaks at 2100 cm$^{-1}$. This attribution is also supported by the existence of the bending mode at 900 cm$^{-1}$. Those of the art believe that the presence of both bonding forms is detrimental to the electronic properties of the semiconductor. In contrast, the present invention provides control of the density of the monohydride and polyhydride bonds. In one embodiment, a positive DC voltage of about eighty volts is applied to the substrates during the deposition process. This DC biasing of the substrate during the reactive sputter deposition influences the formation of the silicon-hydrogen bonds. The silicon film deposited onto the positively biased substrate showed a substantial decrease in the density of polyhydride bonding. The bonding vibration spectra, shown at trace 42, evidences a substantial decrease in the amplitude of the polyhydride characteristic peaks at 2100 cm$^{-1}$ and 900 cm$^{-1}$ as compared to the conventionally sputtered silicon film spectra of trace 40. The positively biased film also evidences a corresponding increase in the amplitude of the monohydride characteristic peak at 2000 cm$^{-1}$. A comparison of trace 40 and trace 42 reveals that the aforedescribed positive bias deposition technique virtually eliminates the presence of polyhydride bonding in the resultant film and correspondingly increases the density of monohydride bonding. A further analysis of the hydrogen content of the film indicates the total hydrogen content of the film film. In a further embodiment, a negative voltage bias of about −100 volts is applied to the substrate(s) during the reactive sputtering. An analysis of the resultant film reveals a decrease in the density of monohydride bonds. A bonding vibration spectra, shown as trace 44, evidences a substantial decrease in the monohydride characteristic peak at 2000 cm$^{-1}$ and a corresponding increase for the polyhydride characteristic peaks at 2100 cm$^{-1}$, as compared to the control sample having a substrate maintained at ground bias, shown as trace 40.

Figure 3:
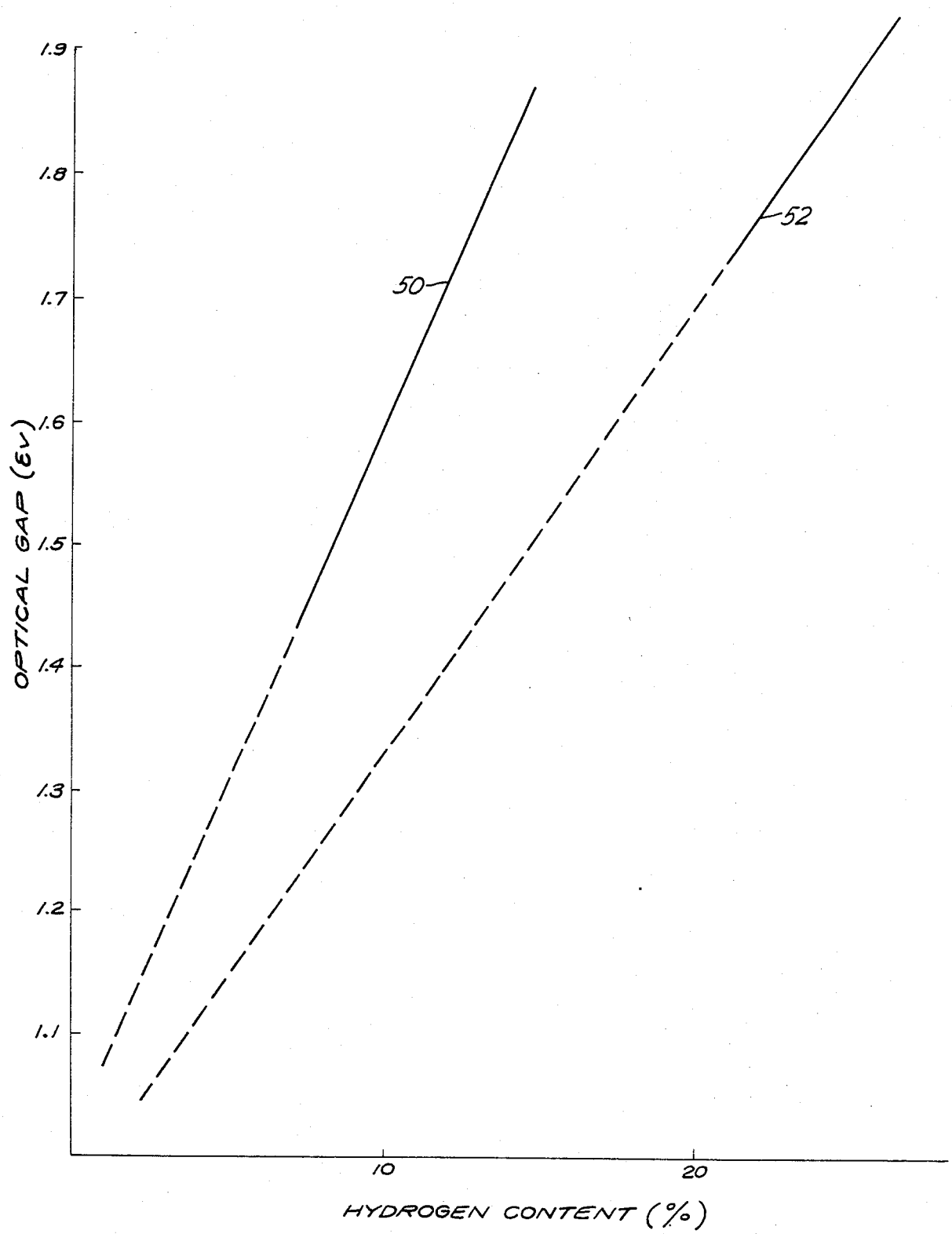
FIG. 3 is a graphic plot of optical gap versus hydrogen content for a series of films deposited on positively biased substrates as compared to a second series of films deposited on electrically grounded substrates.

Referring to FIG. 3, there is shown a graphic plot of optical band gap versus hydrogen content for a plurality DC biased amorphous silicon films, trace 50, shown in comparison to electrically grounded films, trace 52. With the exception of the applied bias, the preparation conditions were substantially identical for the two series of films. These conditions included a cathode to anode spacing of about 4.5 cm, a power density of about 1.6 watt/cm$^2$, a substrate temperature of about 275° C., an argon partial pressure of about 15 m Torr and a hydrogen partial pressure of about $1 \times 10^{-4}$ Torr to about $3 \times 10^{-3}$ Torr. The substrates of the devices resulting in trace 52 were electrically grounded whereas a positive DC bias of about 50 volts was applied to the substrates of the devices resulting in trace 50. The positive bias deposition, which virtually eliminates the polyhydride bonding and increases the monohydride bonding of silicon to hydrogen, functions to increase the optical band gap of the resultant film. Accordingly, an equivalent optical band gap material is produced containing substantially less hydrogen. As presently understood, the bonding of hydrogen to silicon compensates an otherwise (without hydrogen) dangling bond which would have given rise to a band gap state. It is presently believed that when the hydrogen bonds into the network in Sr—H monohydride forms it increases the optical gap substantially more strongly than when it bonds in SiH$_x$ polyhydride forms. Thus, by biasing the substrates positvely during the growth of amorphous silicon hydride films results in a small optical gap material with good electronic properties.

What is claimed is:

1. A method for controlling the silicon to hydrogen bonding in sputtered amorphous silicon comprising reactively sputtering a layer of amorphous silicon in a partial pressure of hydrogen and argon while concurrently applying a predetermined positive DC voltage bias to the sputtered film to produce controlled monohydride and polyhydride bond density in sputtered amorphous silicon films, wherein a positive DC voltage bias is applied to the film to decrease the polyhydride bond density of said film.

2. The method of claim 1 wherein said DC bias voltage ranges from above about ground potential to about 80 volts.

3. The method of claim 1 wherein said process of sputtering is further defined as RF sputtering from a silicon cathode onto a biased anode having an anode to cathode spacing of about 4.5 cm.

4. A method for producing a photoconductive amorphous silicon film having increased monohydride bond density comprising reactively sputtering a layer of amorphous siilicon onto a substrate maintained at a temperature ranging from about 200° C. to about 400° C. and also maintained at a voltage ranging from above about ground potential to about a positive 80 volts, said sputtering being accomplished in partial pressures of argon and hydrogen ranging from about 5m Torr to about 50m Torr and from about $1 \times 10^{-4}$ Torr to about $5 \times 10^{-3}$ Torr respectively and having an RF sputtering power of between about 100 watts and about 500 watts.

5. The method of claim 4 wherein said partial pressure of argon ranges from between about 5 m Torr and about 20 m Torr.

6. The method of claim 5 wherein said partial pressure of argon is about 15m Torr.

7. The method of claim 4 wherein said RF sputtering power is applied to a cathode electrode having cathode to anode spacing of about 4.5 cm.

8. The method of claim 7 wherein said cathode comprises a polysilicon target being about five inches in diameter.

9. In the biased reactive sputtering of amorphous silicon hydride the method comprising applying a predetermined positive substrate bias concurrent with the reactive sputtering to produce controlled monohydride and polyhydride bond density in said amorphous silicon hydride, wherein a positive DC voltage bias is applied to the film to decrease the polyhydride bond density of said film.

* * * * *